(12) United States Patent
Sofer et al.

(10) Patent No.: US 8,432,209 B2
(45) Date of Patent: Apr. 30, 2013

(54) METHOD FOR POWER REDUCTION AND A DEVICE HAVING POWER REDUCTION CAPABILITIES

(75) Inventors: Sergey Sofer, Reshon Letzion (IL); Vlad Goldman, Kfar Saba (IL); Noam Sivan, Ganey Tikva (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/265,343

(22) PCT Filed: May 14, 2009

(86) PCT No.: PCT/IB2009/052019
§ 371 (c)(1),
(2), (4) Date: Oct. 20, 2011

(87) PCT Pub. No.: WO2010/131076
PCT Pub. Date: Nov. 18, 2010

(65) Prior Publication Data
US 2012/0032720 A1     Feb. 9, 2012

(51) Int. Cl.
*H03K 3/289* (2006.01)
(52) U.S. Cl.
USPC ............ 327/208; 327/199; 327/210; 327/218
(58) Field of Classification Search .................. 327/199, 327/202–203, 208, 210–212, 214, 215, 218, 327/219, 225
See application file for complete search history.

(56) References Cited

U.S. PATENT DOCUMENTS 7,138,842 B2 * 11/2006 Padhye et al. ................. 327/203
(Continued)

FOREIGN PATENT DOCUMENTS

KR    10-2007-0059626 A    6/2007

OTHER PUBLICATIONS

Hossain, R. et al: "Low power design using double edge triggered flip-flops" IEEE Transactions on Very Large Scale Integration (VLSI) Systems, Jun. 1994, vol. 2, Issue 2, pp. 261-265.
(Continued)

*Primary Examiner* — Long Nguyen

(57) ABSTRACT

A device that includes a dual edge triggered flip-flop that has state retention capabilities, the dual edge triggered flip-flop includes: a retention latch that includes a first inverter, a second inverter and a first transfer gate; wherein the first and second inverters receive power during a power gating period; a second latch that includes a third inverter, a fourth inverter and a second transfer gate; wherein the third and fourth inverters are powered down during a power gating period; a third transfer gate that is coupled between input nodes of the retention latch and the second latch; wherein the third transfer gate is opened during the power gating period; wherein the first transfer gate is controlled by a control signal and the second transfer gate is controlled by an inverted control signal; wherein the retention latch stores, at the end of the power gating period a retention value; wherein the retention value is selected, in response to a value of the control signal when the power gating period starts, out of a first initial value stored at the retention latch at the beginning of the power gating period and a second initial value stored at the second latch at the beginning of the power gating period.

20 Claims, 6 Drawing Sheets

U.S. PATENT DOCUMENTS

| | | |
|---|---|---|
| 7,181,188 B2 | 2/2007 | Vu et al. |
| 2006/0220717 A1 | 10/2006 | Padhye et al. |
| 2008/0315931 A1 | 12/2008 | Maeda |
| 2009/0058485 A1 | 3/2009 | Berzins et al. |
| 2011/0248759 A1* | 10/2011 | Chi et al. .................. 327/202 |

OTHER PUBLICATIONS

International Search Report and Written Opinion correlating to PCT/IB2009/052019 dated Feb. 3, 2010.

* cited by examiner

METHOD FOR POWER REDUCTION AND A DEVICE HAVING POWER REDUCTION CAPABILITIES

FIELD OF THE INVENTION

The present invention relates to a method for power consumption reduction and a device having power consumption reduction capabilities.

BACKGROUND OF THE INVENTION

Power Gating

In modern wireless devices one of the most important figures of merit is power consumption. In order to reduce power consumption, device defines low-power states.

The power consumed by a circuit includes leakage power and switching power. Leakage power is attributed to leakage current that flows through circuit components (such as transistors, diodes, and the like) while switching power is attributed to switching activities of these circuit components.

Power gating techniques involve operating a circuit (such as a processor) at a maximal frequency at nominal supply voltage level during activation periods and shutting down the circuit power supply during deactivation periods, also known as low power periods or power gating periods. Under certain circumstances the logic values stored at memory, registers, flip-flops, latches and the like must be preserved during deactivation periods. This assumes supplying a keep-alive (retention) power to those specific elements and their control elements. Such technique is named State Retention Power Gating (SRPG).

The main concern for SRPG flip-flop is the number of semiconductor devices (e.g. MOSFETs) that must remain powered by a retention power supply. The fewer devices in the SRPG flip-flop will remain powered during the low-power period, the less leakage power will be consumed. Therefore those skilled in the art may appreciate that conventionally only one latch cell (out of two for a classical flip-flop) in the SRPG flip-flop remains powered during the low-power period.

Dual Edge Triggered Flip Flops

Dual edge triggered flip flops include a pair of latching cells—one latches data in response to a positive edge of a clock signal while the other latches data in response to a negative edge of the clock signal. The latch that is selected to output the output value of the dual edge trigger flip flop depends on the logic level of the clock signal and is arbitrary when a power gating period starts. This ambiguity complicates any state retention scheme, when one can not know which latch cell (out of two) must remain powered and retain its value.

SUMMARY OF THE INVENTION

The present invention provides a method and a device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

In the following specification, the invention will be described with reference to specific examples of embodiments of the invention. It will, however, be evident that various modifications and changes may be made therein without departing from the broader spirit and scope of the invention as set forth in the appended claims.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

It has been shown that by powering a retention latch of a dual edge triggered flip-flop and storing a retention value that has either a first or second initial value, a dual edge triggered flip flop with state retention capabilities can be provided.

Figure 1:
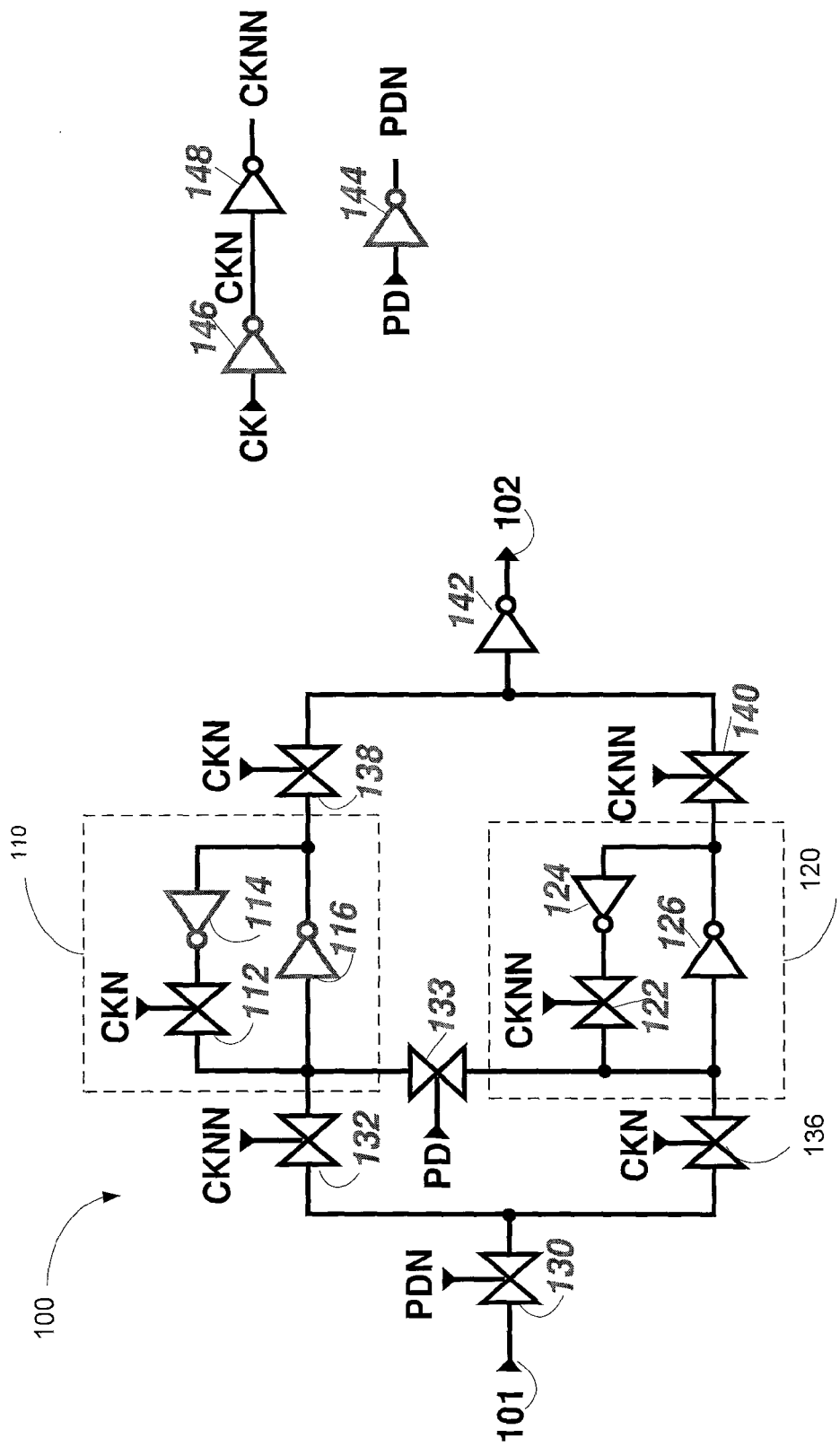
FIG. 1 schematically shows an example of an embodiment of a device.

FIG. 1 schematically shows an example of an embodiment of device 10. Device 10 includes one or more dual edge triggered (DET) flip-flops such as DET flip-flop 100. Device 10 can be an integrated circuit, can include one or more integrated circuits, and can be used in a mobile phone, a media player, a computer, a server and the like.

DET flip-flop 100 has state retention capabilities. It includes retention latch 110, second latch 120, third transfer gate 133, multiple transfer gates 130, 132, 136, 138, 140 and fifth inverter 142.

DET flip-flop 100 can be controlled by one or more control signals such a clock signal (denoted CLK), an inverted clock signal (denoted CLKN), a buffered (i.e. twice inverted) clock signal (denoted CLKNN) a power gating signal (denoted PD), an inverted power gating signal (denoted PDN). These control signals can open transfer gates or can close transfer gates. A transfer gate is open (i.e. transfers a signal between its ports) when it enables current flow through it.

The inverted control signals (CLKN, PDN) and signals derived from these inverted control signals (such as CLKNN which is an inverted signal of CLKN) can be generated per DET flip-flop or per multiple DET flip-flops of device 10.

A power gating period is a period during which a gated supply voltage is turned off and conventionally all signals driven by devices connected to gated power supply receive low logic value (although those signals will not get exact zero voltage due to a finite leakage current through the closed power supply switch and whole the power-gated devices in power-gate circuit). Thus if the level of CLK was low when the power gating period started it remains at a low value throughout the power gating period. If the level of CLK was high when the power gating period starts it falls to a low value after a short intermediate period.

Retention latch 110 includes first inverter 114, second inverter 116 and first transfer gate 112. First and second inverters 114 and 116 receive power during a power gating period and during other periods. The input of first inverter 114 is connected to an input node of retention latch 110. The output of first inverter 114 is connected to an output node of retention latch 110. The input of second inverter 116 is connected to the output node of the retention latch. The output of second inverter 116 is connected to an input of first transfer gate 112. The output of first transfer gate 112 is connected to the input node of retention latch 110.

Second latch 120 does not receive power during the power gating period.

Second latch 120 includes third inverter 124, fourth inverter 126 and second transfer gate 122. The input of third inverter 124 is connected to an input node of second latch 120. The output of third inverter 126 is connected to an output node of second latch 120. The input of fourth inverter 126 is connected to the output node of second latch 120. The output of fourth inverter 126 is connected to an input of second transfer gate 122. The output of second transfer gate 122 is connected to the input node of second latch 120.

Third transfer gate 133 is connected between the input nodes of retention latch 110 and second latch 120 and is opened during the power gating period.

First transfer gate 112 is controlled by a control signal and second transfer gate 122 is controlled by an inverted control signal. In FIG. 1 the control signal is CLK and the inverted clock signal is CLKN.

Referring to the CMOS logic, a transfer gate includes a PMOS transistor that is connected in parallel to an NMOS transistor. These CMOS transistors receive a pair of control signals. A transfer gate is controlled by a control signal if the gate of its NMOS transistor receives that control signal and the gate of its PMOS transistor receives a complementary control signal.

Just before a power gating period starts and at the beginning of the power gating period retention latch 110 stores a first initial value and second latch stores a second initial value. These values can differ from each other or be equal to each other. Each power gating period is associated with a first initial value and a second initial value.

At the end of the power gating period retention latch 110 stores a retention value that is selected from the first and second initial values. The selection is responsive to the value of a control signal (such as CLK) when the power gating period starts.

The retention value can equal the first initial value if the control signal is low when the power gating period starts. The retention value can equal the second initial value if the control signal is high when the power gating period starts.

The control signal can be the clock signal or can be affected by the value of the control signal and even one or more other signals such as the power gating signal.

If the control signal (for example CLK) is high at the beginning of the power gating period it is low after an intermediate period that is shorter than the power gating period and remains low after the power gating period.

Assuming that at the beginning of the power gating period second transfer gate 122 is open and first transfer gate 112 is closed then the second initial value (which is latched by second latch 120) must be preserved during the power gating period. Since the retention is done in the first latch 110, the second initial value is therefore written (via third transfer gate 133) to the input node of retention latch 110. At this stage (at the beginning of the intermediate period) the retention latch 110 does not latch this value—because first transfer gate 112 is closed and thus the feedback loop of the retention latch 110 is open. Nevertheless, at the end of the intermediate period CLK falls to the voltage, corresponding to low logic value (coupled to the gated power supply voltage), first transfer gate 112 is opened and second transfer gate 122 is closed so that retention latch 110 latches the second initial value.

Assuming that at the beginning of the power gating period second transfer gate 122 is closed and first transfer gate 112 is open then the first initial value is stored at retention latch 110 during the entire power gating period.

Retention latch 110 and second latch 120 can be at least partially isolated from the input node and, additionally or alternatively, from the output node of DET flip-flop 100.

This isolation can assist in additional leakage prevention (or at least reduce the leakage of DET flip-flop 100), and can prevent outside signals (including e.g. retention supply noises, cross-coupling-caused noises and the like) to affect the value that is latched in retention latch 110.

FIG. 1 illustrates fourth transfer gate 130, fifth transfer gate 132, sixth transfer gate 136, seventh transfer gate 138 and eighth transfer gate 140.

Fourth transfer gate 130 is connected between input node 101 of DET flip-flop 100 and inputs of fifth and sixth transfer gates 132 and 136. The output of the fifth transfer gate 132 is connected to the input node of retention latch 110. The output of the sixth transfer gate 136 is connected to the input node of second latch 120.

Seventh transfer gate 138 is connected between the output node of retention latch 110 and an input of fifth inverter 142. Eighth transfer gate 140 is connected between the output node of second latch 120 and the input of fifth inverter 142. The output of fifth inverter 142 is connected to an output node 102 of DET flip-flop.

Fourth transfer gate 130 is controlled by PDN and is closed during the power gating period and open outside the power gating period. Fifth transfer gate 132 and eighth transfer gate 140 are controlled by CLKNN and are closed during the entire power gating period if at the beginning of the power gating period CLK was low. If CLK was high at the beginning of the power gating period than fifth transfer gate 132 and eighth transfer gate 140 are opened until the intermediate period ends and CLK is going to low logic value.

Sixth transfer gate 136 and seventh transfer gate 138 are controlled by CLKN are open during the entire power gating period if at the beginning of the power gating period CLK was low (and CLKN was high). If CLK was high at the beginning of the power gating period than sixth transfer gate 136 and seventh transfer gate 138 are opened after the intermediate period ends.

Device 10 also includes sixth inverter 144, seventh inverter 146 and eighth inverter 148. Sixth inverter 144 receives PD and outputs PDN. Seventh inverter 146 receives CLK and outputs CLKN. Eighth inverter 148 receives CLKN and outputs CLKNN.

During the power gating period first inverter 114, second inverter 116, sixth inverter 144 and seventh inverter 146 are powered i.e. they receive a non-gated supply voltage (retention supply). Other inverters such as third, fourth, and eighth inverters 124, 126 and 148 are not powered. They receive a gated supply voltage that is not provided during a power gating period.

Figure 2:
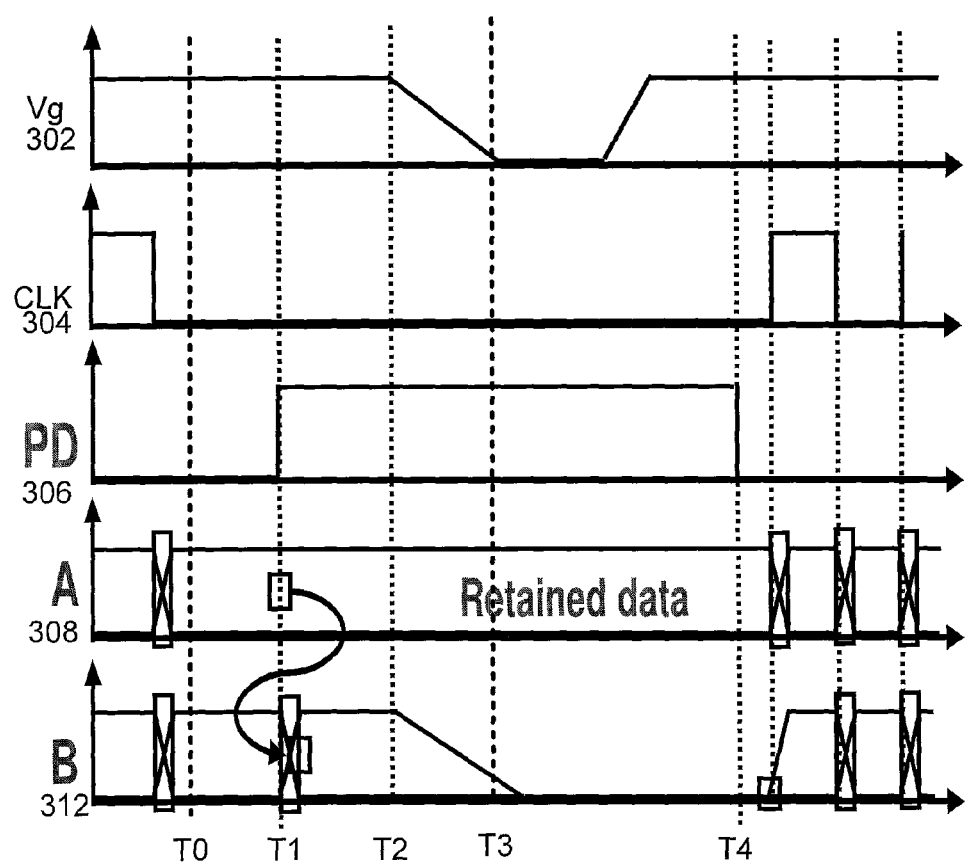
FIG. 2 is an example of a timing diagram.
Figure 3:
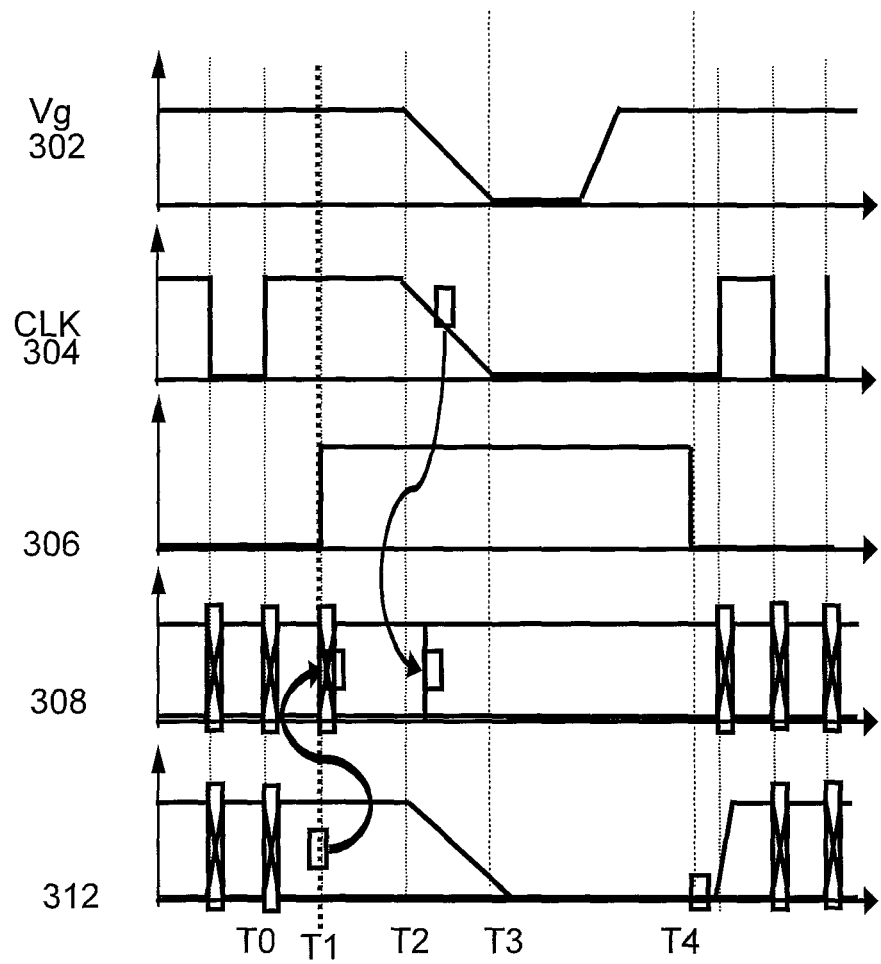
FIG. 3 is an example of a timing diagram.

FIG. 2 and FIG. 3 are examples of timing diagrams. They illustrate signals such as a gated supply voltage (Vddg) 302, CLK 304, PD 306, first (retention) latch data (A) 308, and second latch data (B) 312.

Tables 1 and 2 illustrate various values of these signals (as well as an output signal Q of DET flip-flop 100) at different points in time—before (T0) the power gating period (PGP), during PGP (T1-T3) and when PGP ends (T4).

TABLE 1

| | Vddg | CLK | PD | A | B | Q | Comment |
|---|---|---|---|---|---|---|---|
| T0 | H | 0 | 0 | Va | Vb | Va | Before PGP |
| T1 | H | 0 | 1 | Va | — | — | PGP starts, retention latch continues to store Va |
| T2 | H | 0 | 1 | Va | — | — | Vddg starts to fall |
| T3 | L | 0 | 1 | Va | — | — | |
| T4 | H | 0 | 0 | Va | — | Va | PGP ends. Vddg is raised before T4, retention value = Va |

TABLE 2

| | Vddg | CLK | PD | A | B | Q | Comment |
|---|---|---|---|---|---|---|---|
| T0 | H | 1 | 0 | Va | Vb | Vb | Before PGP |
| T1 | H | 1 | 1 | | Vb | — | PGP starts and intermediate period start, second latch latches Vb and sends Vb to the first (retention) latch |
| T2 | H | 0 | 1 | Vb | Vb | — | Vddg and CLK start to fall |
| T3 | L | 0 | 1 | Vb | — | — | CLK and Vddg are low |
| T4 | H | 0 | 0 | Vb | — | Vb | PGP ends. Vddg is raised before T4, retention value = Vb |

Figure 4:
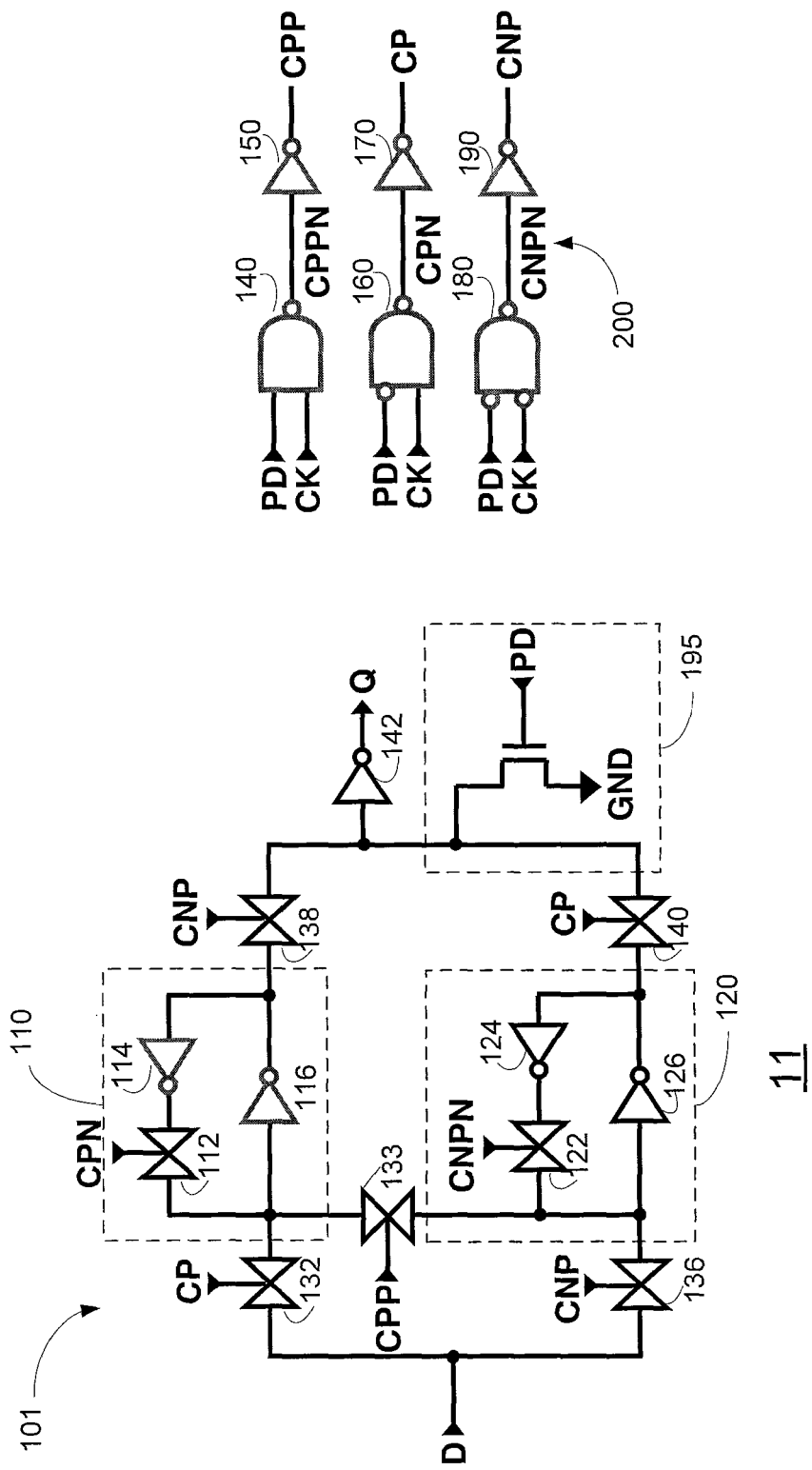
FIG. 4 schematically shows an example of another embodiment of a device.

FIG. 4 schematically shows another example of an embodiment of device 11. Device 11 includes one or more dual edge triggered (DET) flip-flops such as DET flip-flop 101. Device 11 can be an integrated circuit, can include one or more integrated circuits, can be a mobile phone, a media player, a computer, a server and the like.

DET flip-flop 101 differs from DET flip flop 100 of FIG, by not including fourth transfer gate 130, by including a pull-down circuit 195 and by including logic circuit 200 instead of sixth, seventh and eighth inverters 144, 146 and 148. In addition, the transfer gates (112, 122, 132, 133, 136, 138 and 140) of DET flip flop 101 are controlled by control signals such as CP, CPN, CNP and CPP and not by control signals PD, CLK and CLKN. Control signals CP, CPN, CNP and CPP are generated by logic circuit 200. Logic circuit 200 is powered during the power gating period.

CPP controls third transfer gate 133 so that third transfer gate 133 is maintained closed immediately before the power gating period starts and during the power gating period if a value of the clock signal at the beginning of the power gating period is low. In addition, third transfer gate 133 is closed after the intermediate period ends if at the beginning of the power gating period the clock signal was high.

Logic circuit includes a first NAND gate 140, a second NAND gate 160, a third NAND gate 180, and ninth till eleventh inverters 150, 170 and 190.

First NAND gate 140 receives as inputs PD and CLK and outputs CPPN. CPPN is provided to ninth inverter 150 that outputs CPP. Second NAND gate 160 receives at an inverting input PD and at a non inverting input CLK and outputs CPN. CPN is provided to tenth inverter 170 that outputs CP. Second NAND gate 160 receives at an inverting input PD and at a non inverting input CLK and outputs CPN. CPN is provided to tenth inverter 170 that outputs CP. Third NAND gate 180 receives at its inverting inputs PD and CLK and outputs CNPN. CNPN is provided to eleventh inverter 190 that outputs CNP.

CPN controls first and sixth transfer gates 112 and 136. CP controls fifth and eighth transfer gates 132 and 140. CPP controls third transfer gate 133. CNPN controls second transfer gate 122. Pull-down circuit 195 is controlled by PD and serves for providing a signal having deterministic logic value (low in this example of the embodiment of the invention) to the gate of the fifth inverter 142 when PD signal is high.

EDT flip flop 101 reduces leakage by maintaining third transfer gate 133 closed unless the second initial value should be sent to the retention latch 110. The provision of a pull-down signal by pull-down circuit 195 and the lack of fourth transfer gate 130 can also contribute to the reduction of leakage and especially leakage through the gates of transistors that are included in transfer gates and inverters. Those skilled in the art may appreciate that the device 101 is applicable for e.g. semiconductor technology with high MOSFET gate leakage and less applicable for semiconductor technology with relatively low MOSFET gate leakage.

Figure 5:
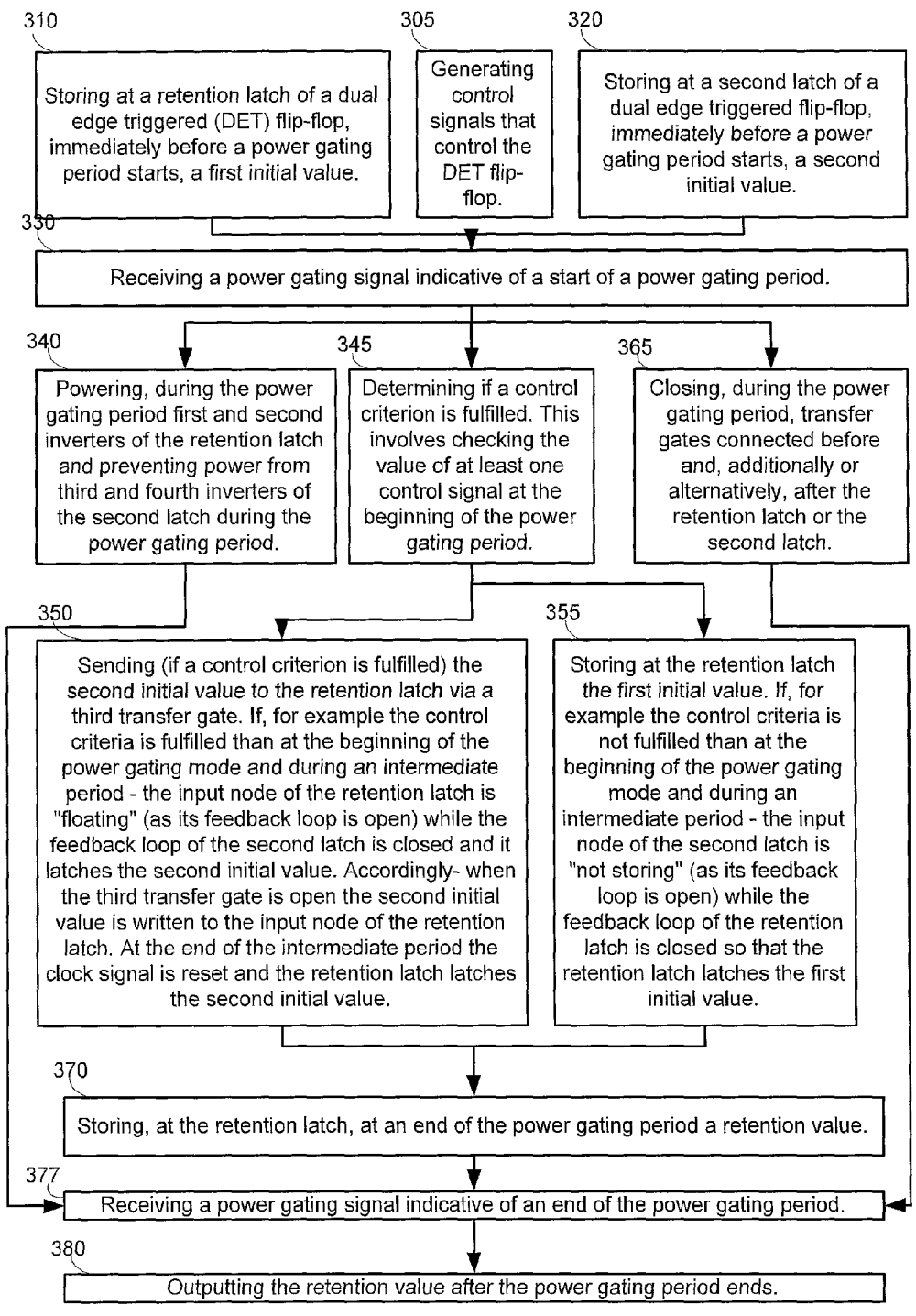
FIG. 5 schematically shows an example of an embodiment of a method.

FIG. 5 illustrates method 300. Method 300 starts by stages 310 and 320.

Stage 310 includes storing at retention latch of a dual edge triggered (DET) flip-flop, immediately before a power gating period starts, a first initial value.

Stage 320 includes storing at a second latch of a dual edge triggered flip-flop, immediately before a power gating period starts, a second initial value.

Stages 310 and 320 are followed by stage 330 of receiving a power gating signal indicative of a start of a power gating period.

Stage 330 is followed by stages 340, 345, 350, 355 and 365.

Stage 340 includes powering, during the power gating period first and second inverters of the retention latch and preventing power from third and fourth inverters of the second latch during the power gating period.

Stage 345 includes determining if a control criterion is fulfilled. This involves checking the value of at least one control signal at the beginning of the power gating period.

Referring to the example set fourth in FIG. 1, the control criteria is fulfilled if at the beginning of the power gating period CLK is high.

Stage 345 is followed by stage 350 of sending (if a control criterion is fulfilled) the second initial value to the retention latch via a third transfer gate. If, for example the control criteria is fulfilled than at the beginning of the power gating period and during an intermediate period—the retention latch is "not storing" (as its feedback loop is open) while the feedback loop of the second latch is closed and it latches the second initial value. Accordingly—when the third transfer gate is open the second initial value is written to the retention latch. At the end of the intermediate period the clock signal goes low together with the gated power supply voltage and the retention latch latches the second initial value. It is noted that the third transfer gate can be closed after the power is prevented from third and fourth inverters.

Else, stage 345 is followed by stage 355 of storing at the retention latch the first initial value. If, for example the control criteria is not fulfilled than at the beginning of the power gating mode and during an intermediate period—the second latch is "not storing" (as its feedback loop is open) while the feedback loop of the retention latch is closed so that the it latches the first initial value.

Accordingly, if the control criteria is fulfilled the retention value equals the second initial value and if not it equals the first initial value.

Stage 365 can include closing, during the power gating period, transfer gates connected before and, additionally or alternatively, after the retention latch or the second latch. For example, stage 365 can include closing a fourth transfer gate that has an input that is connected to an input node of the dual edge triggered flip flop.

Stages 350 and 355 are followed by stage 370 of storing, at the retention latch, at an end of the power gating period a retention value.

Stage 370 is followed by stage 377 of receiving a power gating period indicative that the power gating period ended.

Stage 377 is followed by stage 380 of outputting the retention value after the power gating period ends.

Method 300 can be implemented by device 10. For example, the retention value can equal the first initial value if the control signal is low when the power gating period starts; and the retention value can equal the second initial value if the control signal is high when the power gating period starts.

Method 300 can also include stage 305 of generating control signals that control the DET flip-flop. Stage 305 can include, for example, inverting, by a seventh inverter the control signal to provide an inverted control signal. Stage 340 can include powering the seventh inverter during the power gating period.

Stage 305 can include generating a control signal that is a clock signal, wherein that clock signal is gated during the power gating period.

Stage 305 can include generating control signals such as an inverted power gating signal.

Figure 6:
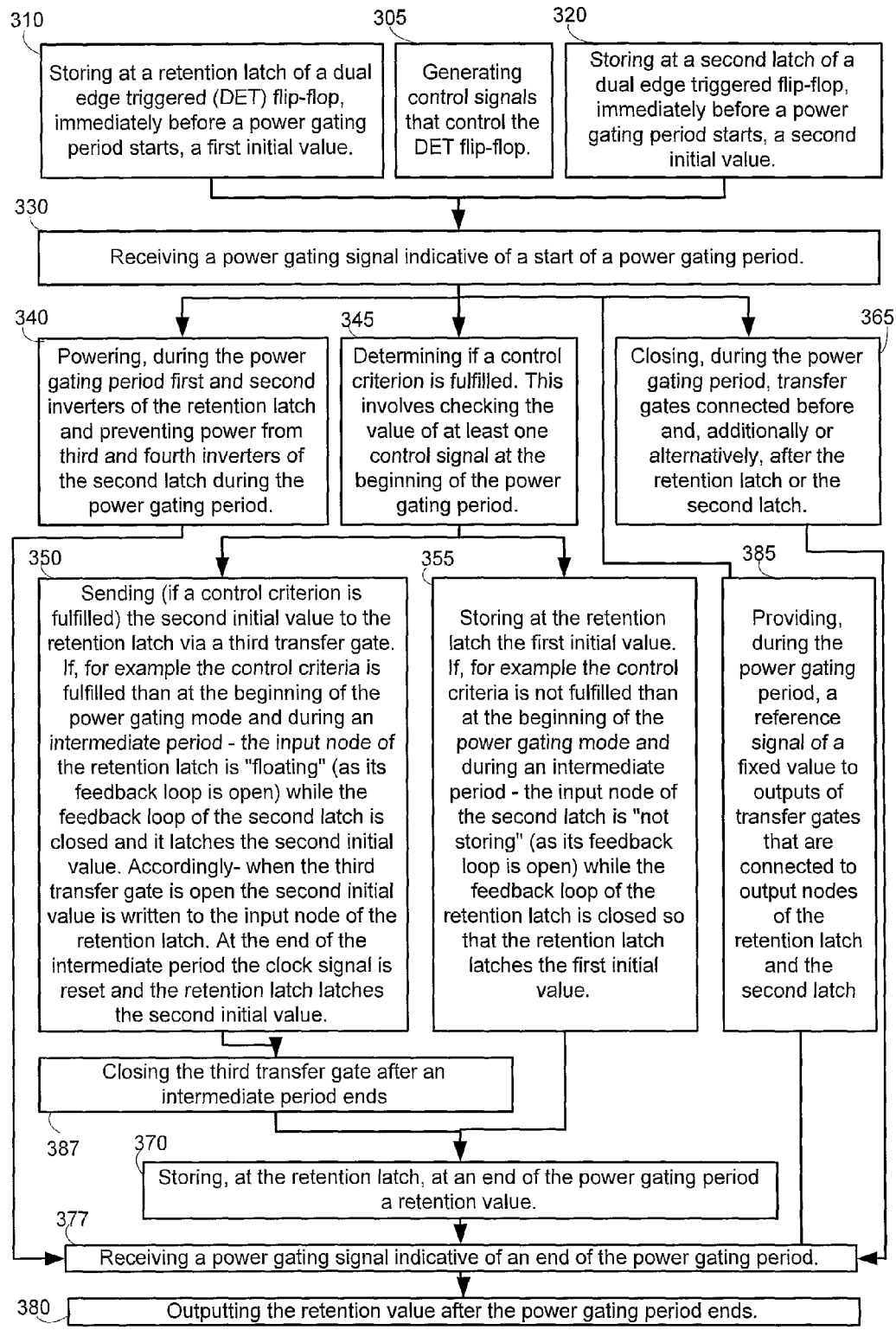
FIG. 6 schematically shows another example of an embodiment of a method.

FIG. 6 illustrates method 301. Method 301 starts by stages 310 and 320.

Stage 310 includes storing at the retention latch of a dual edge triggered (DET) flip-flop, immediately before a power gating period starts, a first initial value.

Stage 320 includes storing, at a second latch of a dual edge triggered flip-flop, immediately before a power gating period starts, a second initial value.

Stages 310 and 320 are followed by stage 330 of receiving a power gating signal indicative of a start of a power gating period.

Stage 330 is followed by stages 340, 345, 350, 355, 365, 375 and 385.

Stage 340 includes powering, during the power gating period first and second inverters of the retention latch and preventing power from third and fourth inverters of the second latch during the power gating period. It is noted that the power can be prevented only after the third transfer gate transfers an initial value from the retention latch to the second latch or from the second latch to the retention latch.

Stage 345 includes determining if a control criterion is fulfilled. This involves checking the value of at least one control signal at the beginning of the power gating period.

Referring to the example set fourth in FIG. 2, the control criteria is fulfilled if at the beginning of the power gating period CPP is high. CPP is generated by applying an AND operation of on a clock signal CLK and a power gating signal PD. This can be achieved by applying a NAND operation and then inverting the outcome of the NAND operation.

Stage 345 is followed by stage 350 of sending (if a control criterion is fulfilled) the second initial value to the retention latch via a third transfer gate. If, for example the control criteria is fulfilled than at the beginning of the power gating mode and during an intermediate period—the retention latch is "not storing" (as its feedback loop is open) while the feedback loop of the second latch is closed and it latches the second initial value. Accordingly—when the third transfer gate is open the second initial value is written to the retention latch. At the end of the intermediate period the clock signal is low and the retention latch latches the second initial value.

Else, stage 345 is followed by stage 355. Stage 355 includes storing at the retention latch the first initial value. If, for example the control criteria is not fulfilled than at the beginning of the power gating mode and during an intermediate period—the second latch is "not storing" (as its feedback loop is open) while the feedback loop of the retention latch is closed so that the retention latch latches the first initial value.

Accordingly, if the control criteria is fulfilled the retention value equals the second initial value and if not it equals the first initial value.

Stage 365 can include closing, during the power gating period, transfer gates connected before and, additionally or alternatively, after the retention latch or the second latch. For example, stage 365 can include closing a fourth transfer gate that has an input that is connected to an input node of the dual edge triggered flip flop.

Stage 355 is followed by stage 370 of storing, at the retention latch, at an end of the power gating period a retention value.

Stage 350 is followed by stage 375 of closing the third transfer gate after an intermediate period ends. The clock signal CLK is low (its driver is powered by the gated power supply) at the end of the intermediate period so that CPP is also low at the end of the intermediate period. This reduces the leakage from the dual edge triggered flip flop. Stage 375 is followed by stage 370.

Stages 370 and 385 are followed by stage 377 of receiving a power gating period indicative that the power gating period ended.

Stage 377 is followed by stage 380 of outputting the retention value after the power gating period ends.

Method 301 can be implemented by device 11. For example, the retention value can equal the first initial value if the control signal is low when the power gating period starts; and the retention value can equal the second initial value if the control signal is high when the power gating period starts.

Method 301 can also include stage 305 of generating control signals that control the DET flip-flop. Stage 305 can include, for example, generating control signals that are responsive to a clock signal and to a power gating signal. For example, it can include generating, from clock signal and power gating signal PD the following control signals: CPP, CPPN, CP, CPN, CNPN and CNP. At least some of these signals can be providing during the power gating period and stage 340 can include powering, during the power gating period, a circuit logic that generates these control signals.

Stage 385 includes providing, during the power gating period, a reference signal (that can be a pull down signal) of a fixed value to outputs of transfer gates that are connected to output nodes of the retention latch and the second latch. This can reduce leakage through gates of transistors of these latches.

Any reference herein and before to a logic signal level "1", "high", "H" or "set" means logic high level, while any reference to a signal logic level "0", "low", "L" or "reset" means logic low level. Conventionally, logic high level corresponds to a level equal (or close within some tolerance) to continuous power supply voltage, while logic low level corresponds to a level equal (or close within some tolerance) to the ground voltage. Conventionally, during the power down period the gated power supply reaches the logic low level due to e.g. gated circuit leakage or special pull-down mechanisms.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps from those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A device, comprising a dual edge triggered flip-flop that has state retention capabilities, the dual edge triggered flip-flop comprises:
   a retention latch that comprises a first inverter, a second inverter and a first transfer gate; wherein the first and second inverters receive power during a power gating period;
   a second latch that comprises a third inverter, a fourth inverter and a second transfer gate; wherein the third and fourth inverters are powered down during the power gating period;
   a third transfer gate that is coupled between input nodes of the retention latch and the second latch; wherein the third transfer gate is opened during the power gating period;
   wherein the first transfer gate is controlled by a control signal and the second transfer gate is controlled by an inverted control signal;
   wherein the retention latch stores, at the end of the power gating period a retention value; wherein the retention value is selected, in response to a value of the control signal when the power gating period starts, out of a first initial value stored at the retention latch at the beginning of the power gating period and a second initial value stored at the second latch at the beginning of the power gating period.

2. The device according to claim 1 wherein the retention value equals the first initial value if the control signal is low when the power gating period starts; and wherein the retention value equals second initial value if the control signal is high when the power gating period starts.

3. The device according to claim 1 wherein if the control signal is high at the beginning of the power gating period it is low after an intermediate period that is shorter than the power gating period; wherein during the intermediate period the second initial value is transferred, via the third transfer gate; wherein after the intermediate period ends the second initial value is stored in the retention latch.

4. The device, according to claim 1 wherein an input node of the retention latch is coupled to a fifth transfer gate; wherein an input node of the second latch is coupled to a sixth transfer gate; wherein an output node of the retention latch is coupled to a seventh transfer gate; wherein an output node of the second latch is coupled to a eighth transfer gate; wherein the fifth transfer gate and the eighth transfer gates are opened when the control signal is of a high logic level and wherein the sixth transfer gate and the seventh transfer gates are opened when the control signal is of a low logic level.

5. The device according to of claim 1, comprising a seventh inverter that receives a control signal and outputs an inverted control signal; wherein during the power gating circuit the seventh inverter receives retention power supply.

6. The device, according to claim 1 wherein the control signal is a clock signal that its toggling is stopped during the power gating period and wherein its logic value remains low if it was low immediately before the power gating period, or goes low immediately after the gated power supply goes down if its logic value was high immediately before the power gating period, and wherein its logic value remains low immediately after the power gating period ends.

7. The device according to claim 1 further comprising a fourth transfer gate that is coupled to an input node of the dual edge triggered flip flop; wherein the fourth transfer gate is closed during the power gating period.

8. The device according to claim 1 wherein the third transfer gate is opened during an intermediate period in which a logic value of a clock signal changes from high to low and is closed after the intermediate period.

9. The device according to claim 8 wherein the third transfer gate is maintained closed immediately before the power gating period starts and during the power gating period if a value of the clock signal at the beginning of the power gating period is low.

10. The device according to claim 8 comprising a logic circuit that receives a clock signal and a power gating signal and outputs multiple control signals that control the first transfer gate, the second transfer gate and the third transfer gate; wherein the logic circuit is powered during the power gating period.

11. The device according to claim 8 wherein an output node of the retention latch is coupled to an input of a seventh transfer gate; wherein an output node of the second latch is coupled to an input of a eighth transfer gate; and wherein outputs of the seventh transfer gate and the eighth transfer gate are coupled to a pull-down circuit that pulls down the node connected to outputs of the seventh transfer gate the eighth transfer gates and the input of the fifth inverter during the power gating period.

12. A method, comprising:
storing at a retention latch of a dual edge triggered flip-flop, immediately before a power gating period starts, a first initial value;
storing at a second latch of the dual edge triggered flip-flop, immediately before the power gating period starts, a second initial value;
receiving the power gating signal indicative of a start of a power gating period;
powering, during the power gating period a first and second inverters of the retention latch and preventing power from a third and fourth inverters of the second latch during the power gating period;
sending, if a control criteria is fulfilled, the second initial value to the retention latch via a third transfer gate;
storing, at the retention latch, at an end of the power gating period a retention value; wherein the retention value is selected out of the first initial value and the second initial value, in response to a value of a control signal at the beginning of the power gating period.

13. The method according to claim 12 wherein a first transfer gate of the retention latch is controlled by the control signal and a second transfer gate of the second latch is controlled by an inverted control signal.

14. The method according to claim 12 wherein the retention value equals the first initial value if the control signal is low when the power gating period starts; and wherein the retention value equals the second initial value if the control signal is high when the power gating period starts.

15. The method according to claim 12 wherein the control criterion is fulfilled during an intermediate period in which a value of a control signal changes from a high value to a low value.

16. The method according to claim 12, comprising inverting, by a seventh inverter the control signal to provide an inverted control signal; wherein the stage of powering comprises powering the seventh inverter during the power gating period.

17. The method, according to claim 12 wherein the control signal is a clock signal.

18. The method according to claim 12 further closing a fourth transfer gate, during the power gating period, wherein the fourth transfer gate is coupled to an input node of the dual edge triggered flip flop.

19. The method according to claim 12 comprising closing the third transfer gate after an intermediate period ends; wherein the intermediate periods starts if at the beginning of the power gating period the control signal has a high value; wherein the intermediate period ends when the control signal has a low value.

20. The method according to claim 12 comprising maintaining the transfer gate closed after an intermediate period ends; wherein the intermediate periods starts if at the beginning of the power gating period the control signal has a high value; wherein the intermediate period ends when the control signal has a low value.

* * * * *